United States Patent
Sun et al.

(10) Patent No.: US 11,037,994 B2
(45) Date of Patent: Jun. 15, 2021

(54) DISPLAY PANEL AND METHOD FOR MANUFACTURING THE SAME

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Kuo Sun, Beijing (CN); Mingche Hsieh, Beijing (CN); Yang Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 8 days.

(21) Appl. No.: 16/393,872

(22) Filed: Apr. 24, 2019

(65) Prior Publication Data

US 2020/0075680 A1    Mar. 5, 2020

(30) Foreign Application Priority Data

Aug. 29, 2018 (CN) .......................... 201810999220.8

(51) Int. Cl.
*H01L 27/32* (2006.01)
*H01L 51/00* (2006.01)
*H01L 51/50* (2006.01)
*H01L 51/52* (2006.01)

(52) U.S. Cl.
CPC ........ *H01L 27/322* (2013.01); *H01L 51/5012* (2013.01); *H01L 51/5256* (2013.01); *H01L 2227/32* (2013.01)

(58) Field of Classification Search
CPC .............. H01L 27/322; H01L 51/5012; H01L 51/5256; H01L 2227/32; H01L 27/3234; H01L 51/5284; H01L 27/326
USPC ......................................................... 257/40
See application file for complete search history.

(56) References Cited

U.S. PATENT DOCUMENTS

| 5,693,962 A | 12/1997 | Shi et al. |
| 2007/0291325 A1 | 12/2007 | Toyota et al. |
| 2010/0238097 A1* | 9/2010 | Baik ............... H04N 13/315 345/87 |

(Continued)

FOREIGN PATENT DOCUMENTS

| CN | 1136713 A | 11/1996 |
| CN | 1938854 A | 3/2007 |

(Continued)

OTHER PUBLICATIONS

First Chinese Office Action dated Mar. 13, 2020, received for corresponding Chinese Application No. 201810999220.8, 15 pages.

*Primary Examiner* — Sheikh Maruf
(74) *Attorney, Agent, or Firm* — Kinney & Lange, P.A.

(57) ABSTRACT

A display panel and a method for manufacturing the same are disclosed. The display panel includes: a display area having a plurality of first pixel units and a plurality of first transparent portions, the first transparent portions being configured such that external light is transmitted from one side of the display panel to the other side of the display panel through the first transparent portions, wherein at least two first pixel units are spaced apart by one or more first transparent portions.

18 Claims, 11 Drawing Sheets

(56) References Cited

U.S. PATENT DOCUMENTS

| | | | | |
|---|---|---|---|---|
| 2011/0062859 A1* | 3/2011 | Kawamura | ............ | H01L 27/322 313/504 |
| 2012/0038267 A1* | 2/2012 | Hanamura | ............ | H01L 27/322 313/504 |
| 2012/0140492 A1* | 6/2012 | Alvarez | ................ | F21V 33/006 362/382 |
| 2014/0085578 A1* | 3/2014 | Gu | ........................ | G02F 1/157 349/106 |
| 2014/0307430 A1* | 10/2014 | Lo | ........................ | G09F 13/00 362/231 |
| 2015/0054719 A1* | 2/2015 | Lee | ...................... | H01L 27/326 345/76 |
| 2015/0085002 A1* | 3/2015 | Li | .......................... | G09G 3/36 345/697 |
| 2016/0012792 A1* | 1/2016 | Li | ....................... | G02F 1/13363 345/92 |
| 2016/0378224 A1* | 12/2016 | Kwon | ..................... | G06F 3/044 345/174 |
| 2017/0271415 A1* | 9/2017 | Yamazaki | ............ | H01L 27/3213 |
| 2019/0043842 A1* | 2/2019 | Guo | ........................ | H01L 33/38 |
| 2019/0131573 A1* | 5/2019 | Baek | ...................... | H01L 51/5012 |
| 2019/0131580 A1* | 5/2019 | Youn | .................... | H01L 51/5275 |
| 2019/0172893 A1* | 6/2019 | Lee | ..................... | H01L 51/5012 |
| 2020/0119113 A1* | 4/2020 | Lee | ....................... | H01L 27/322 |
| 2020/0227487 A1* | 7/2020 | Furuie | ................. | H01L 51/5237 |

FOREIGN PATENT DOCUMENTS

| | | |
|---|---|---|
| CN | 101960917 A | 1/2011 |
| CN | 102376746 A | 3/2012 |
| CN | 103094307 A | 5/2013 |
| CN | 103440822 A | 12/2013 |
| CN | 104425554 A | 3/2015 |
| CN | 104600206 A | 5/2015 |
| CN | 106601768 A | 4/2017 |
| CN | 108269840 A | 7/2018 |

\* cited by examiner

100

200

| forming one or more transparent portions between at least two pixel units to separate the at least two pixel units respectively | S10 |

DISPLAY PANEL AND METHOD FOR MANUFACTURING THE SAME

CROSS-REFERENCE TO RELATED APPLICATION

This application claims the benefit of Chinese Patent Application No. 201810999220.8 filed on Aug. 29, 2018 with the China National Intellectual Property Administration, the disclosure of which is incorporated herein in entirety by reference.

TECHNICAL FIELD

The present disclosure relates to the field of display technologies, and more particularly to a display panel and a method for manufacturing the same.

BACKGROUND

Organic light-emitting diodes (OLEDs), as an aspect of the display technology, have attracted much attention. OLED display technology has the advantages of self-illumination, high brightness, high optical efficiency, fast response, low drive voltage and low power consumption, low cost, fewer processes, etc. OLED technology has been widely used in mobile phones, digital video cameras, DVD players, personal digital assistants (PDA), laptops, car stereos and televisions.

In an OLED display device, cameras or other optical elements are disposed at the periphery area of the display panel or in the non-display area under the display panel. The pixels area of the display panel is provided with structures such as a metal electrode, a light shielding layer, and the like, which are opaque or has a low transparency, such that it is difficult to dispose these optical elements in the area that corresponds to the pixels of the display panel.

SUMMARY

Embodiments of the present disclosure provide a display panel including: a display area having a plurality of first pixel units and a plurality of first transparent portions, the first transparent portions being configured such that external light is transmitted through the first transparent portions from one side of the display panel to the other side of the display panel, wherein at least two first pixel units are spaced apart by one or more first transparent portions.

In some embodiments, the display area includes: an electrode layer which extends in the plurality of first pixel units; and an electrode layer lost region in an orthographic projection area of each of the plurality of first transparent portions.

In some embodiments, the display area further includes a light shielding layer on a light emitting side of the display panel, and the light shielding layer is provided with a first light shielding layer lost region in the light shielding layer in an orthographic projection area of each of the plurality of first pixel units, and provided with a second light shielding layer lost region in the orthographic projection area of each of the plurality of first transparent portions, and a color filter layer is provided in the first light shielding layer lost region.

In some embodiments, the electrode layer includes a metal electrode layer.

In some embodiments, all of portions of the electrode layers are electrically connected together.

In some embodiments, the electrode layer includes a cathode.

In some embodiments, the display area includes: a first region, in which the plurality of first pixel units and the plurality of first transparent portions are located; and a second region having a plurality of second pixel units, each of the plurality of second pixel units being adjacent to its surrounding second pixel units.

In some embodiments, the display area further includes a transition region between the first region and the second region and includes a plurality of third pixel units and a plurality of second transparent portions, and wherein a ratio of a total area of the plurality of second transparent portions to a total area of the plurality of third pixel units is smaller than a ratio of a total area of the plurality of first transparent portions to a total area of the plurality of first pixel units.

In some embodiments, a ratio of a total area of the plurality of first transparent portions to a total area of the plurality of first pixel units is between 1:1 and 15:1.

In some embodiments, the display panel is an organic light emitting diode display panel.

Embodiments of the present disclosure provide a method of manufacturing a display panel having a base substrate and a plurality of pixel units disposed on the base plate, wherein the method includes: forming one or more transparent portions between at least two pixel units to space apart the at least two pixel units, the transparent portions being configured such that external light is transmitted through the transparent portions from one side of the display panel to the other side of the display panel.

In some embodiments, the step of forming one or more transparent portions between at least two pixel units to space apart the at least two pixel units includes: forming an electrode removing portion on the base plate; forming an electrode layer on the base plate provided with the electrode removing portion; and removing the portion of the electrode layer on the electrode removing portion to form the transparent portions.

In some embodiments, the electrode removing portion includes a protrusion.

In some embodiments, the step of forming one or more transparent portions between at least two pixel units to space apart the at least two pixel units further includes: forming a light emitting material layer on the base plate provided with the electrode removing portion after the electrode removing portion is formed on the base plate.

In some embodiments, the step of forming an electrode removing portion on the base plate includes: forming a light emitting material layer on the base plate; and forming an electrode removing portion on the light emitting material layer.

In some embodiments, the electrode layer and the light emitting material layer are formed by evaporation.

In some embodiments, the electrode removing portion includes anti-adhesion material.

In some embodiments, the step of forming one or more transparent portions between at least two pixel units to space apart the at least two pixel units further includes: forming a light shielding layer and a color filter layer on the electrode layer and removing the portions of the light shielding layer and the color filter layer in an orthographic projection area of each of the transparent portions.

In some embodiments, the step of forming one or more transparent portions between at least two pixel units to space apart the at least two pixel units includes: forming a light emitting material layer and an electrode layer on the base plate; and removing the portion of the electrode layer in a predetermined area by plasma bombardment to form the transparent portions.

In some embodiments, the step of forming one or more transparent portions between at least two pixel units to space apart the at least two pixel units includes: forming a light emitting material layer and an electrode layer on the base plate; and removing the portion of the electrode layer in a predetermined area by laser ablation to form the transparent portions.

BRIEF DESCRIPTION OF THE DRAWINGS

In order to further clarify the technical solutions of the embodiments of the present disclosure, the drawings of the embodiments will be briefly described below. It should be understood that the drawings described below only relate to some embodiments of the present disclosure and do not limit the present disclosure.

DETAILED DESCRIPTION OF EMBODIMENTS

Figure 1:
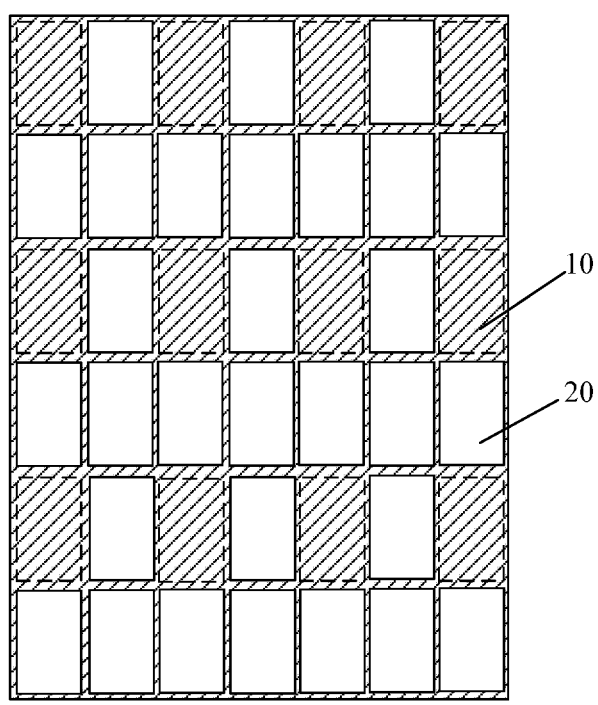
FIG. 1 illustrates a partial schematic view of a display panel in accordance with embodiments of the present disclosure.

In order to illustrate the objects, technical solutions and advantages of the present disclosure more clearly, the embodiments of the present disclosure will be described in detail below with reference to the accompanying drawings. It is to be understood that the following description of the embodiments is intended to illustrate and describe the concept of the present disclosure and should not be considered restrictive. In the specification and the drawings, the same or similar reference numerals refer to the same or similar components or members. For the sake of clarity, the drawings are not necessarily drawn to scale, and some of the well-known components and structures may be omitted in the drawings.

Unless otherwise defined, technical terms or scientific terms used in the present disclosure are intended to be understood as having the ordinary meaning for those skilled in the art. The words "first", "second" and the like used in the present disclosure are not intended to indicate any order, number, or priority, but to distinguish different components. The word "a" or "an" does not exclude a plurality. The word "comprising" or "including" and the like mean that the element or item before the word is intended to encompass the element, the item and the like recited after the word, and not exclude other element or item. The word "connect" or "couple" and the like are not limited to physical or mechanical connections, but may include electrical connections, including direct or indirect connections. The words "upper", "lower", "left", "right", "top", "bottom" and the like are only used to indicate relative positional relationship. When the absolute position of the described object changes, their relative positional relationship may also change accordingly. When an element, such as a layer, a film, a region or a substrate, is referred to as being "on" or "under" another element, the element can be "on" or "under" another element "directly". Alternatively, there may be intermediate elements between them.

In practice, in addition to the display panel, the display device may also include some optical elements, such as a camera, to realize the functions such as photographing, information recognizing, and the like. These optical elements are usually located at the outside of the display area. In order to minimize the non-display area, it is usually desired to arrange these optical elements under the display area of the display panel. However, the display area of the display panel is usually provided with layers of a low light transmittance, such as a metal electrode layer, a light shielding layer, and the like, which makes it difficult for these optical elements to obtain sufficient light energy to achieve their function. One technical solution is to omit all the display-related components from a portion of the display area such that this portion may be used particularly for the optical elements to achieve their function. However, this solution would cause a large loss to the size of the displayed image of the display area. To this end, the inventors conceived a display panel having a partial transparent display region. Herein, the display area refers to the area of the display panel where an image can be displayed.

FIG. 1 illustrates a partial schematic view of a display area of a display panel 100 in accordance with embodiments of the present disclosure. In this display area, there are provided with a plurality of pixel units (hereinafter referred to as the first pixel unit 10, for example, as indicated by the dotted box, for the convenience of description) for displaying image and a plurality of transparent portions (hereinafter referred to as the first transparent portions 20 for the convenience of description) through which the external light is capable of being transmitted from one side of the display panel 100 to the other side of the display panel 100. In the part of the display area that is shown in FIG. 1, the first pixel units 10 and the first transparent portions 20 are distributed and mixed. At least two (e.g., each) first pixel units 10 are respectively spaced apart by one or more first transparent portions 20. Such region of the display area that includes the mixed pixel units and transparent portions is referred to as a partial transparent region. Compared with the conventional display area filled with the pixel units, such partial transparent region has a higher light transmittance, thereby satisfying the requirement for the light transmittance of the optical elements under the display panel as described above. Moreover, the partial transparent region still has a certain number of pixel units for realizing the display function, so that the partial transparent region can have a display function while meeting the operating conditions of the optical element. This is very helpful for achieving the full-screen display. In the example shown in FIG. 1, the ratio of the total area of the first transparent portions 20 to the total area of the first pixel units 10 is 3:1, that is to say, the ratio of the total area of the first pixel units 10 and the first transparent portions 20 to the total area of the first pixel units 10 is 4:1. However, embodiments of the present disclosure are not limited thereto. For example, in the partial transparent region above, the ratio of the total area of the first transparent portions 20 to the total area of the first pixel units 10 may be set between 1:1 and 15:1. As an example, the first pixel units 10 and the first transparent portions 20 may be distributed alternately in the above-described partial transparent region, or may be distributed and mixed in any other pattern.

Herein, the first transparent portions, the second transparent portions, and the like refer to the portions of the display area of the display panel that have high light transmittance, being formed by removing layers with a low light transmittance, such as a metal (e.g., non-transparent) electrode layer, a black matrix layer, and the like.

Figure 2:
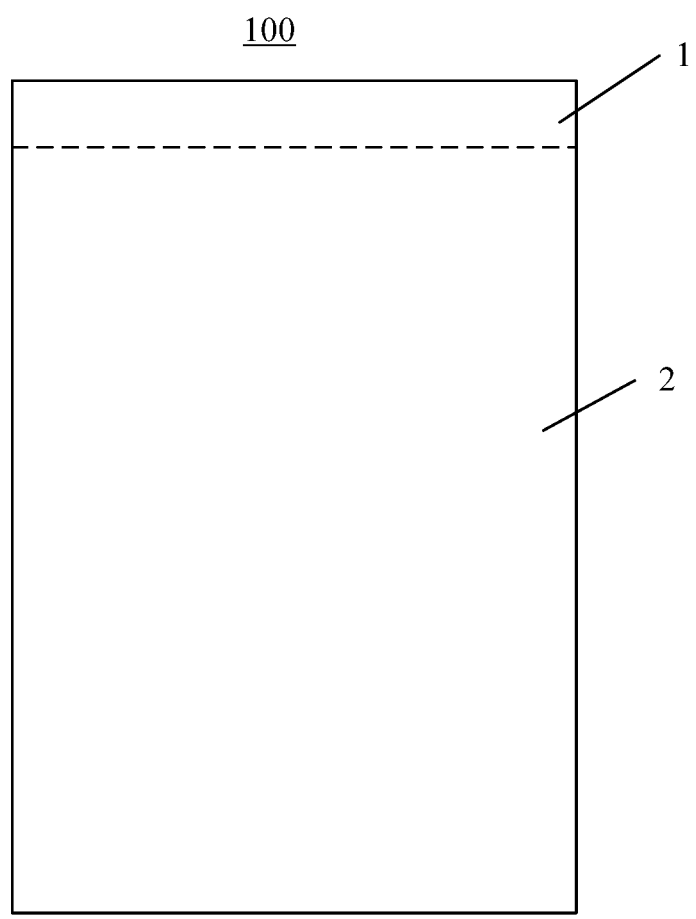
FIG. 2 illustrates a schematic view of an entire display panel in accordance with embodiments of the present disclosure.
Figure 6:
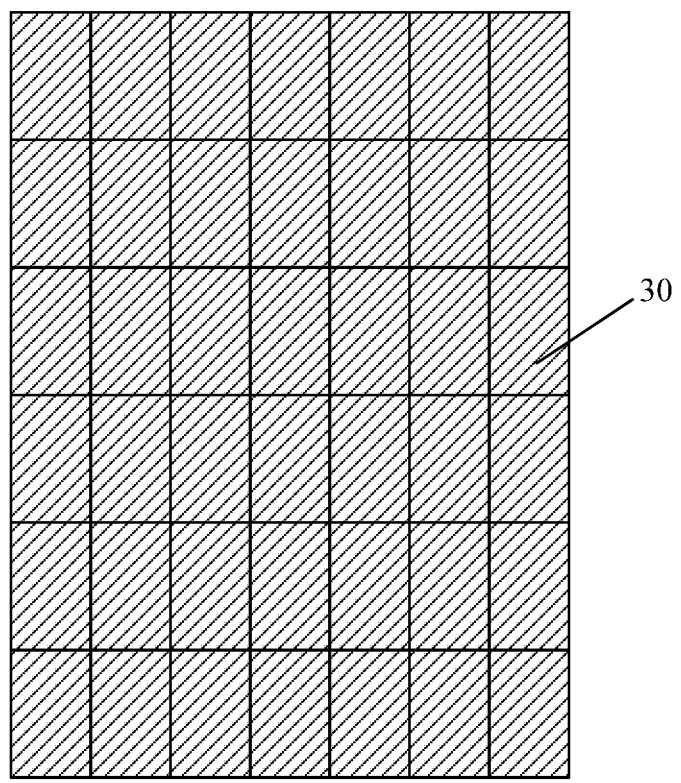
FIG. 6 illustrates a schematic view of a second region (normal display region) on a display panel in accordance with embodiments of the present disclosure.

FIG. 2 illustrates a top view of the entire display panel in accordance with embodiments of the present disclosure. Typically, the optical elements having additional function would not occupy a large part of the display area of the display panel, but are located merely in a relatively small part instead. This part may be referred to as a first region 1 (e.g., the upper margin region as illustrated in FIG. 2). Thus, the plurality of first pixel units 10 and the plurality of first transparent portions 20 may be distributed and mixed in the first region 1 so as to make the first region 1 to be the partial transparent region, while the pixel units are arranged densely in the normal display area (hereinafter referred to as the second region 2 for convenience of description), where there is no need to meet the requirement of the optical elements for the light transmittance, to ensure the resolution of the displayed image. For convenience of description, the pixel unit located in the first region 1 is referred to as the first pixel unit 10, and the pixel unit located in the second region 2 is referred to as the second pixel unit 30. In the second region 2, each of the plurality of second pixel units 30 is adjacent to its surrounding second pixel units 30 as shown in FIG. 6.

The expression "in the second region, each of the plurality of second pixel units is adjacent to its surrounding second pixel units" means that: all the second pixel units in the second region are not spaced apart by the first transparent portions described above. That is to say, there are no first transparent portions disposed in the second region, and the density of the second pixel units in the second region corresponds to the resolution of the normally displayed image.

Figure 5:
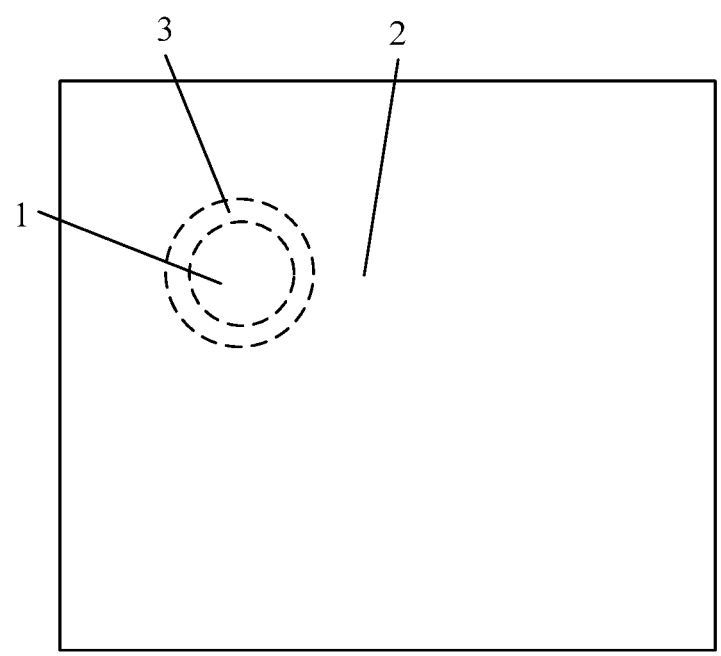
FIG. 5 illustrates a schematic view of a display panel showing a transition region in accordance with embodiments of the present disclosure.
Figures 7, 8:
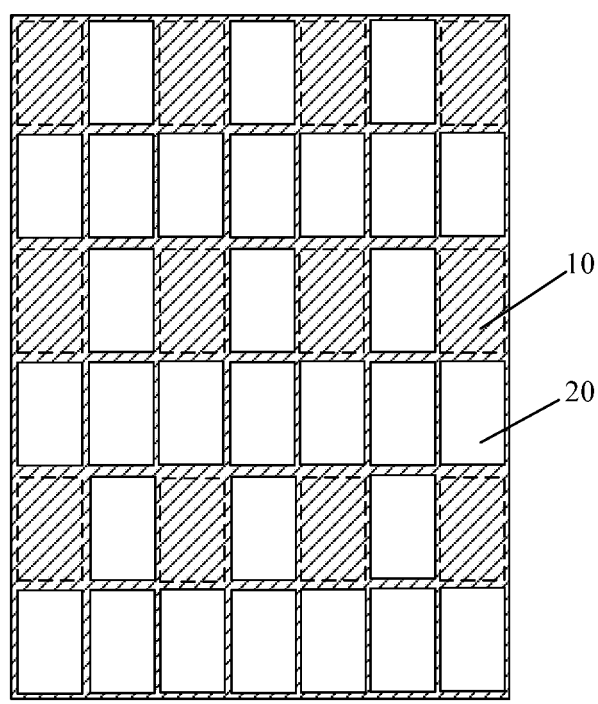
FIG. 7 illustrates a schematic view of a transition region on a display panel in accordance with embodiments of the present disclosure.
FIG. 8 illustrates a flow chart of a method of forming a partial transparent region on a display panel in accordance with embodiments of the present disclosure.

Since the first region 1 and the second region 2 has different density of pixel units, their display effects also differ from each other. In order to avoid a sudden change in display effect caused by the transition between the first region 1 and the second region 2 described above, the display area may further include a transition region 3 between the first region 1 and the second region 2, as shown in FIG. 5. A plurality of third pixel units 40 and a plurality of second transparent portions 50 may be disposed in the transition region 3. The ratio of the total area of all second transparent portions 50 to the total area of all third pixel units 40 in the transition region 3 is less than the ratio of the total area of all first transparent portions 20 to the total area of all first pixel units 10 in the first region 1. That is to say, the density of the pixel units in the transition region 3 is larger than that of the first region 1 and less than that of the second region 2. For example, as shown in FIG. 1, the ratio of the total area of all first transparent portions 20 to the total area of all first pixel units 10 in the first region 1 is 3:1, while the ratio of the total area of all second transparent portions 50 to the total area of all third pixel units 40 in the transition region 3 is 1:1, as shown in FIG. 7.

Figure 3:
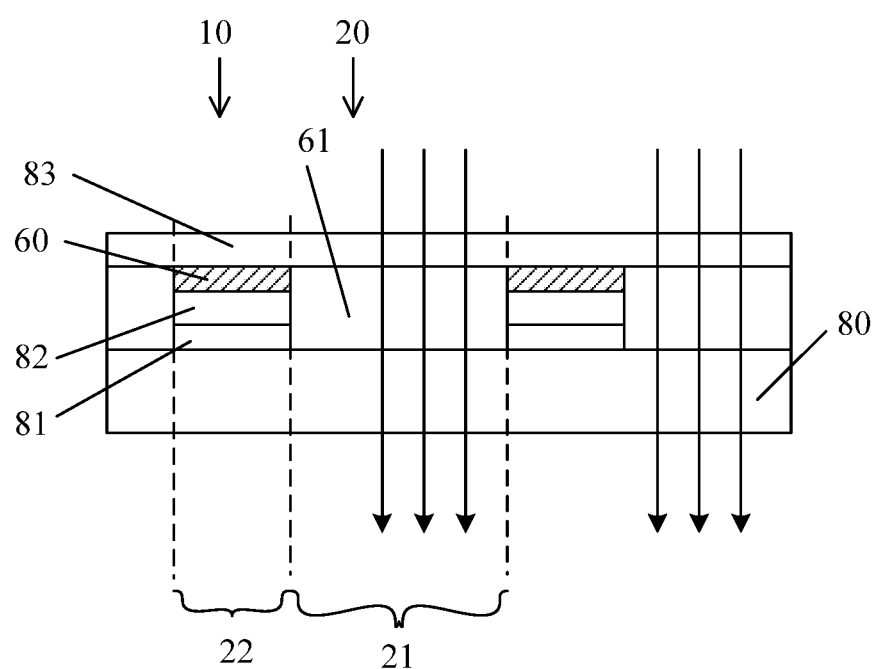
FIG. 3 illustrates a partial cross-sectional view of a display panel in accordance with embodiments of the present disclosure.

In an example, a first electrode layer 60 (e.g., a metal electrode layer or a non-transparent electrode layer) is disposed in the display area, as shown in FIG. 3. The first electrode layer 60 extends in the first pixel unit 10 and an electrode layer lost region 61 is provided in the orthographic projection area 21 of the first transparent portions 20. The electrode layer lost region 61 is formed by breaking the first electrode layer 60 in this region. The electrode layer lost region 61 prevents the light (as indicated by the arrow in FIG. 3) passing through the first transparent portions 20 from being blocked by the first electrode layer 60, thereby ensuring the light transmission effect of the first transparent portions 20. In other words, the first transparent portions 20 is formed largely due to the presence of the electrode layer lost region 61 (e.g., by removing the corresponding portion of the first electrode layer). Here, the "orthographic projection area 21 of the first transparent portions 20" refers to the area covered by the orthographic projection of the first transparent portions 20. In other words, the electrode layer lost region 61 disposed in the orthographic projection region 21 of the first transparent portions 20 has an orthographic projection on the base substrate 80 which would fall within the orthographic projection of the first transparent portions 20 on the base substrate 80.

As can be seen from FIG. 3, the display panel 100 may further include the necessary structure for implementing the display function. For example, the display panel 100 may include a base substrate 80, a second electrode layer 81 (which may be used, for example, as an anode), a light emitting material layer 82, a thin film encapsulation 83, and the like. As an example, the first electrode layer 60 can be used as the cathode of a light-emitting element, but embodiments of the present disclosure are not limited thereto. For example, the first electrode layer 60 may also be used as the anode of a light-emitting element. It should be noted that if a plurality of metal (or non-transparent) electrode layers are disposed in the display panel (for example, the second electrode layer 81 is also a metal (or non-transparent) electrode layer (including a transflective layer)), their portions that correspond to the first transparent portions 20 may be all removed. In some embodiments, the various portions of the first electrode layer 60 are electrically connected together, which facilitates the application of voltage to the first electrode layer 60.

Figure 4:
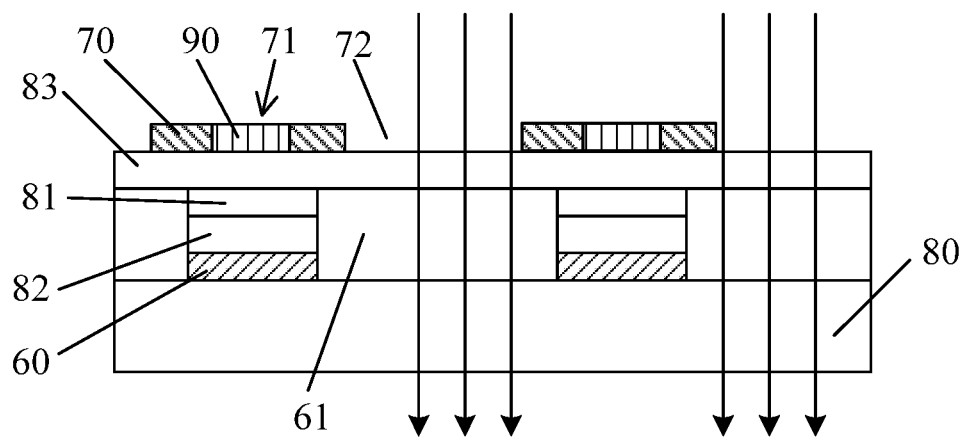
FIG. 4 illustrates a partial cross-sectional view of a display panel in accordance with other embodiments of the present disclosure.

In another example, a light shielding layer 70, such as a black matrix layer, is further disposed in the display area. As shown in FIG. 4, the light shielding layer 70 is located on the light emitting side of the display panel 100. The light shielding layer 70 has a first light shielding layer lost region 71 in the orthographic projection area 22 of the first pixel unit 10. Similar to the above description regarding the orthographic projection area 21, herein the expression "the orthographic projection area 22 of the first pixel unit 10" refers to the area covered by the orthographic projection of the first pixel unit 10. In other words, the first light shielding layer lost region 71 (the light shielding layer 70 is broken at the first light shielding layer lost region 71) located in the orthographic projection region 22 of the first pixel unit 10 has an orthographic projection on the base substrate which falls within the orthographic projection of the first pixel unit 10 on the base substrate. A color filter layer 90 is provided in the first light shielding layer lost region 71. The color filter layer 90 allows the light of corresponding color emitted by the first pixel unit 10 to pass. The combination of the light shielding layer 70 and the color filter layer 90 may prevent the displayed image from being interfered by the external stray light. It can be used to replace a circular polarizer. The light shielding layer 70 is provided with a second light shielding layer lost regions 72 in the orthographic projection areas 21 of the first transparent portions 20. The light shielding layer 70 is also broken at the second light shielding layer lost region 72. Similar to the above-mentioned electrode layer lost region 61, the second light shielding layer lost region 72 may also be used to prevent the external light from being blocked by the light shielding layer 70, thereby ensuring the light transmission effect of the first transparent portions 20. In the example of FIG. 4, since the light emitting side of the display panel 100 is the side facing away from the base substrate, the first electrode layer 60 is located on the side of the light emitting material layer 82 that is closer to the base substrate 80, so as to prevent the first electrode layer 60 from blocking the light emitted from the light emitting material layer 82. In the example of FIG. 4, the second electrode layer 81 may be a transflective layer, which may be a non-metal layer or a metal layer (for example, the metal layer may be also partially transparent when it is thin enough. In order to increase the light transmittance at the first transparent portions 20, the portions of the second electrode layer 81 in the orthographic projection areas 21 of the first transparent portions 20 are also removed to form a lost region.

It is advantageous for the display panel having a partial transparent region according to embodiments of the present disclosure to replace the circular polarizer with the combination of the light shielding layer 70 and the color filter layer 90. In the case where a circular polarizer is used, in order to ensure the light transmission effect of the first transparent portions 20, it is necessary to remove the portions of the circular polarizer in the orthographic projection areas 21 of the first transparent portions 20. However, it is difficult to partially remove the circular polarizer due to its material and additional complicated processes are required. For the light shielding layer 70 described above, however, the first light shielding layer lost region 71 and the second light shielding layer lost region 72 may be formed at the same time only by adjusting the mask pattern for forming the light shielding layer 70. That is, the first light shielding layer lost regions 71 for arranging the color filter layer 90 and the second light shielding layer lost regions 72 for forming the first transparent portions 20 may be formed in one and the same process step. In this way, it can be avoided that the difficulty in manufacturing the display panel is increased significantly due to the introduction of the transparent portions.

As an example, the orthographic projections of the second light shielding layer lost region 72 and the electrode layer lost region 61 on the base substrate may at least partially overlap. As an example, a thin film encapsulation (TFE) 83 may be disposed above the first electrode layer 60, and the light shielding layer 70 and the color filter layer 90 may be positioned above the thin film encapsulation 83.

In an embodiment, the display panel 100 may be an organic light emitting diode display panel. That is, the pixel unit in the display panel 100 includes an organic light emitting diode device as a light emitting device. However, embodiments of the present disclosure are not limited thereto, and the design of the partial transparent region provided by the present disclosure may also be applied to other types of display panels.

Embodiments of the present disclosure also provide a method 200 for manufacturing a display panel. The display panel 100 includes a base substrate 80 and a plurality of pixel units 10, 30 and 40 disposed on the base substrate 80. As shown in FIG. 8, the method includes a step S10: forming one or more transparent portions between at least two (e.g., each of) pixel units to separate the at least two (e.g., each of) pixel units respectively. The transparent portions are configured such that the external light can be transmitted from one side of the display panel to the other side of the display panel. As described above, in this way, a partial transparent region may be formed in the display area of the display panel, so that the area has both high light transmittance and display function. In embodiments of the present disclosure, the base substrate 80 may be a substrate made of a transparent material such as glass, resin, and the like for supporting the light emitting device.

Figure 9:
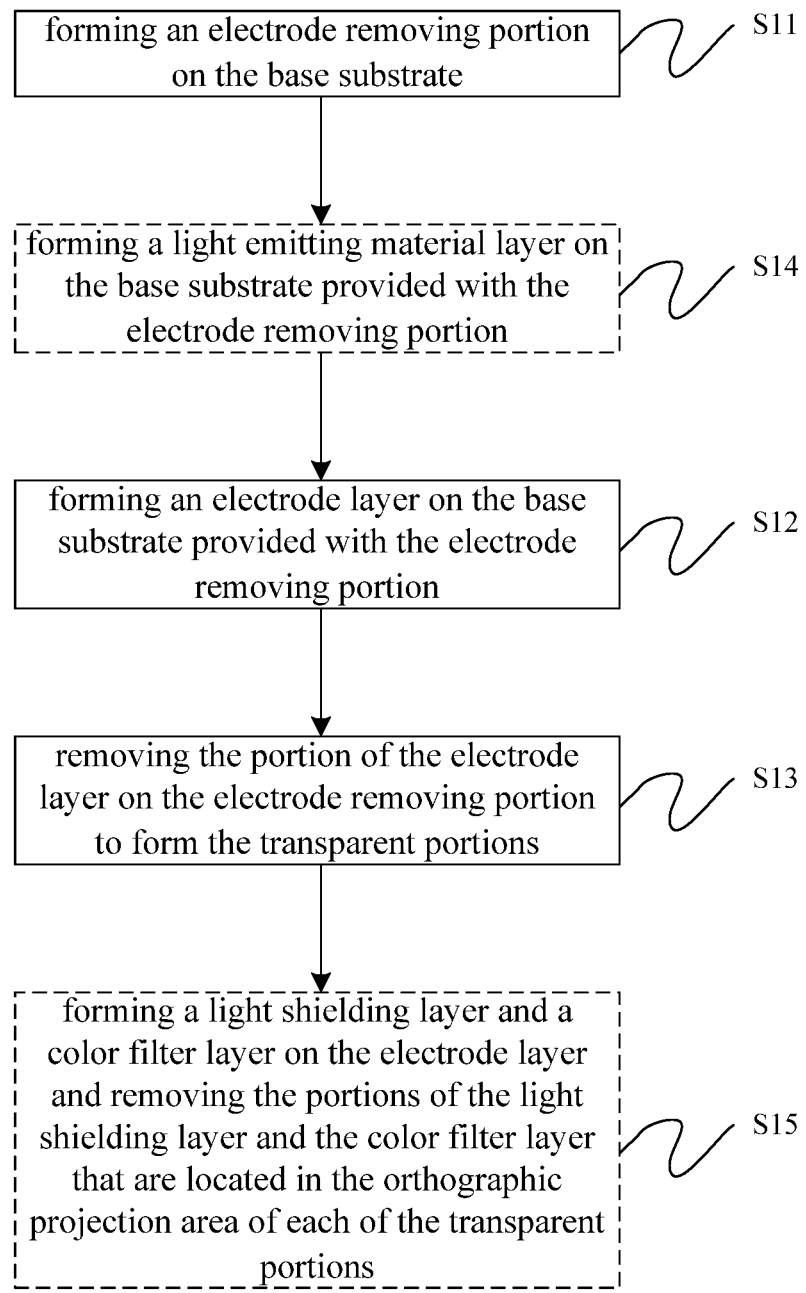
FIG. 9 shows an exemplary flowchart of the specific sub-steps of step S10 shown in FIG. 8.
Figure 10:
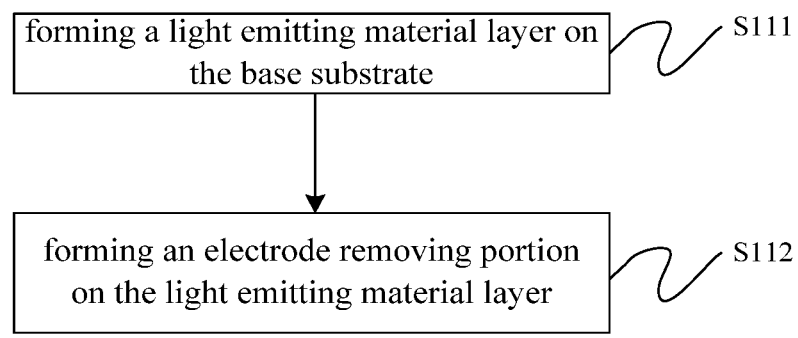
FIG. 10 shows an exemplary flowchart of the specific sub-steps of step S11 shown in FIG. 9.

As an example, as shown in FIG. 9, in the above method 200, the step S10 may further include:

Step S11: forming an electrode removing portion on the base substrate;

Step S12: forming an electrode layer (for example, the first electrode layer 60) on the base substrate which is provided with the electrode removing portion; and Step S13: removing the portion of the electrode layer on the electrode removing portion to form the transparent portions.

For the patterning of the electrode layers (e.g., metal electrode layers), a conventional method is to form a pattern by the photoresist covering the electrode layer and etching the electrode layer based on the pattern in the photoresist. However, in the case where the display panel is an OLED display panel, the above etching process will encounter problems. The organic light-emitting material layer is inevitably included in the light-emitting device in the OLED display panel. The organic light-emitting material layer is typically sensitive to ordinary etching liquids, and thus the ordinary etching process may cause undesired damage to the organic light-emitting material layer. Therefore, in the above embodiments of the present disclosure, another method is employed to remove local portions of the electrode layer to form transparent portions.

Figure 12:
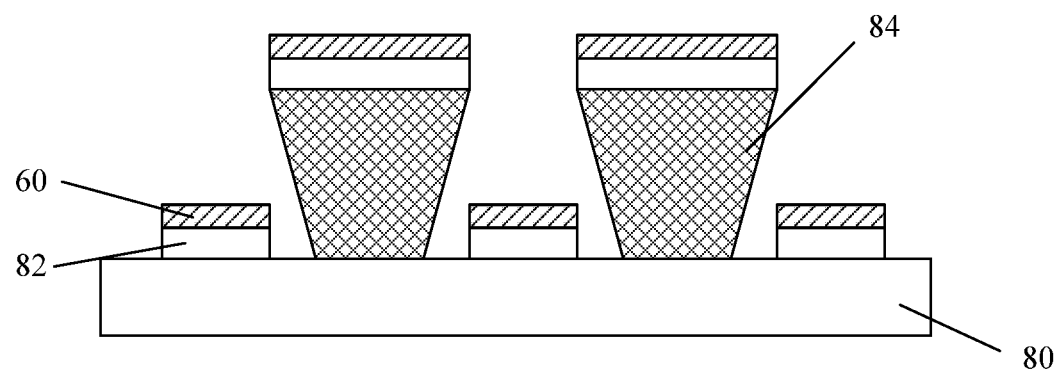
FIG. 12 illustrates a schematic view of the structure on a base substrate before an electrode layer is partially removed by an electrode removing portion in a method of forming a partial transparent region on a display panel according to embodiments of the present disclosure.
Figure 13:
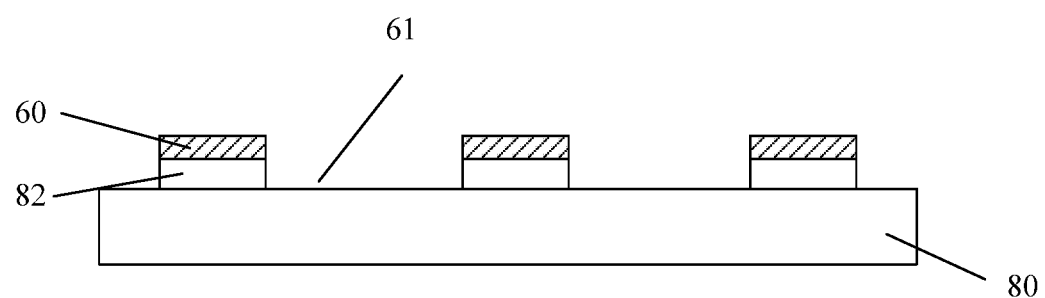
FIG. 13 illustrates a schematic view of the structure on a substrate after partially removing an electrode layer by an electrode removing portion in a method of forming a partial transparent region on a display panel according to embodiments of the present disclosure.

As shown in FIG. 12, an electrode removing portion is formed on the base substrate 80 before the first electrode layer 60 is formed. In this example, the electrode removing portion includes a protrusion 84. The protrusion 84 may be made of photoresist (e.g., negative photoresist). The protrusion 84 may have, for example, an inverted trapezoidal structure. After the above-described protrusion 84 is formed on the base substrate 80, the first electrode layer 60 is formed, and thus a structure as shown in FIG. 12 is obtained. Thereafter, the protrusion 84 may be lifted off, for example by a lift-off liquid (a known photoresist lift-off liquid may be used for the protrusion made of photoresist), thereby removing the portion of the first electrode layer 60 that is attached on the protrusion 84 together. By means of the protrusion 84, the corresponding portion of the first electrode layer 60 is removed, and then an electrode layer lost region 61 is formed, as shown in FIG. 13.

As an example, the step S10 may further include a step S14: forming a light emitting material layer on the base substrate which is provided with the electrode removing portion, after forming the electrode removing portion on the base substrate and before forming the electrode layer (for example, the first electrode layer 60). An optional step is shown in the dotted box in FIG. 9. As shown in FIGS. 12 and 13, the light emitting material layer 82 and the first electrode layer 60 may be formed sequentially on the base substrate on which the electrode removing portion is provided. As described above, when the electrode removing portion (protrusion 84) is lifted off, the corresponding portions of the first electrode layer 60 and the light emitting material layer 82 thereon would be removed together. It is to be noted that, in general, the light transmittance of the light emitting material layer 82 is relatively high, and thus the step of removing the light emitting material layer is optional from the viewpoint of increasing the light transmittance. However, for the example shown in FIGS. 12 and 13, the step of forming the light emitting material layer is arranged after the step of forming the protrusion 84, which is advantageous to prevent the emitting material layer from being affected by the previous process steps for forming the protrusion 84. It should be noted that, in the example illustrated in FIG. 13, the light emitting material layer 82 is located under the first electrode layer 60 (e.g., may be used for the bottom emitting type LED), but embodiments of the present disclosure are not limited thereto. For example, the light emitting material layer 82 may alternatively be located above the first electrode layer 60 (e.g., for a top emitting type LED). In the latter case, the light emitting material layer 82 may also be formed after the electrode layer is formed.

As an example, the step S11 may further include:

Step S111: forming a light emitting material layer on the base substrate; and

Step S112: forming an electrode removing portion on the light emitting material layer.

Figure 14:
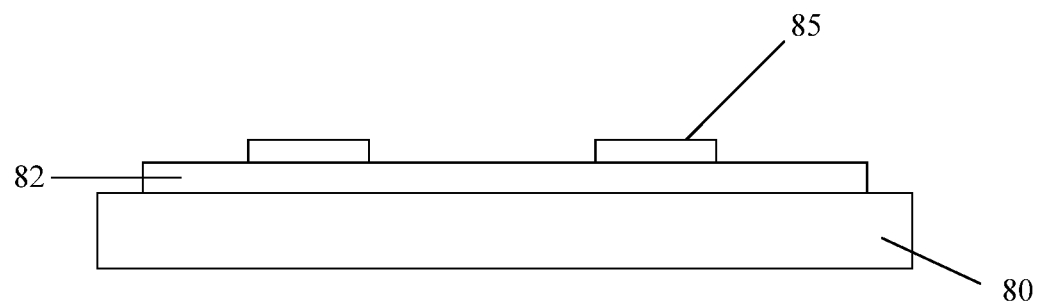
FIG. 14 illustrates a schematic view of the structure on a base substrate before forming an electrode layer in a method of forming a partial transparent region on a display panel according to other embodiments of the present disclosure.
Figure 15:
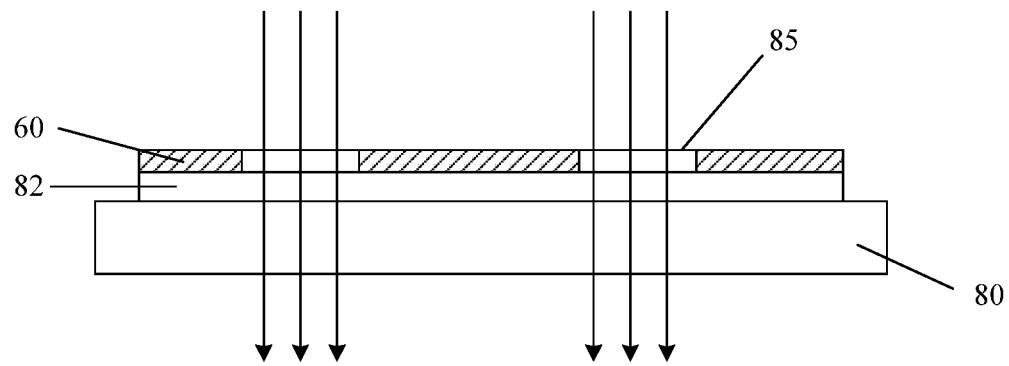
FIG. 15 illustrates a schematic view of the structure on a base substrate after partially removing the electrode layer by the electrode removing portion in a method of forming a partial transparent region on a display panel according to other embodiments of the present disclosure.

FIGS. 14 and 15 show an example in which an electrode removing portion is formed on the light emitting material layer 82. In this example, the electrode removing portion includes anti-adhesion material 85. As shown in FIG. 14, after the light emitting material layer 82 is formed completely, the anti-adhesion material 85 is formed (for example, by evaporation) at a specified position on the light emitting material layer 82, for example by means of a Fine Metal Mask (FMM). Then, the first electrode layer 60 is formed. The anti-adhesion material 85 may be any material that has a weak adhesion to the first electrode layer 60 (or whose surface energy does not match the first electrode layer 60, such as organic material). Due to the characteristics of the anti-adhesion material 85, the portion of the first electrode layer 60 on the anti-adhesion material 85 can be lifted off automatically, thereby removing the corresponding portion of the first electrode layer 60.

In the above embodiments of the present disclosure, the first electrode layer 60 may be formed by evaporation. Similarly, the light emitting material layer 82 may also be formed by evaporation. However, embodiments of the present disclosure are not limited thereto, and the first electrode layer 60 and the light emitting material layer 82 may also be formed in other known manners.

It should be noted that the electrode layer located on the side of the light emitting material layer 82 that is close to the base substrate 80 can be patterned by the aforementioned conventional photolithography-etching process, and thus the details are omitted herein.

As an example, as shown in FIG. 8, the step S10 may further include a step S15: forming a light shielding layer and a color filter layer on the electrode layer and removing the portions of the light shielding layer and the color filter layer that are located in the orthographic projection area of each of the transparent portions. As shown in FIG. 4, a light shielding layer 70 and a color filter layer 90 may be disposed on the light emitting side of the display panel 100 to suppress external stray light. In this case, the pattern of the mask may be adjusted in the step of forming the patterns of the light shielding layer 70 and the color filter layer 90, such that the light shielding layer 70 and the color filter layer 90 would be avoided from being formed in the orthographic projection area of each of the transparent portions, thereby ensuring the high light transmittance of the transparent portions in the display panel.

Figure 11:
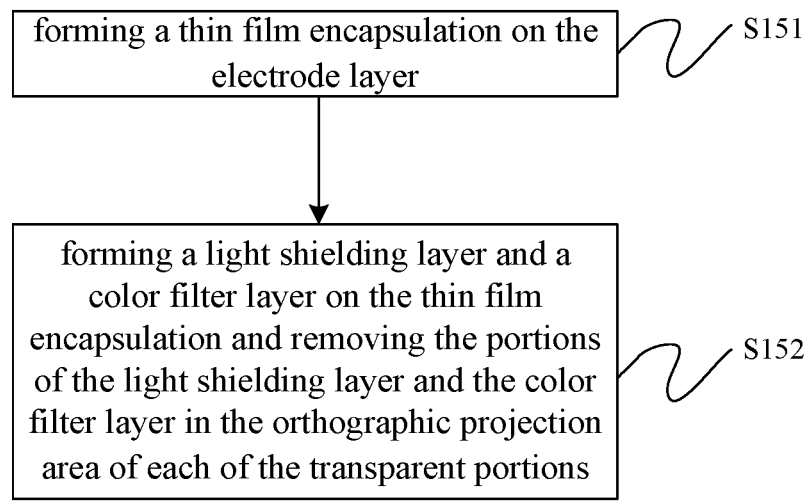
FIG. 11 shows an exemplary flowchart of the specific sub-steps of step S15 shown in FIG. 9.

As an example, as shown in FIG. 11, the step S15 may further include:

Step S151: forming a thin film encapsulation on the electrode layer (for example, the first electrode layer 60); and Step S152: forming a light shielding layer and a color filter layer on the thin film encapsulation and removing the portions of the light shielding layer and the color filter layer which are located in the orthographic projection area of each of the transparent portions. The thin film encapsulation 83 may include, for example, a three-layer structure, e.g., SiNx/organic material (which may be made by an ink-jet process)/SiNx. The thin film encapsulation 83 is used for covering the first electrode layer 60, the light emitting material layer 82, and the like in the display panel, and separating them from the light shielding layer 70 and the color filter layer 90.

It should be understood by those skilled in the art that other layers, such as a second electrode layer 81 (for example, used as an anode), an insulating layer, and the like, may be disposed on the display panel 100, in addition to the first electrode layer 60 (for example, used as a cathode), the light emitting material layer 82, the light shielding layer 70, the color filter layer 90, and the like described above. The process of forming these layers is completely the same as that in the related art, and therefore the details of the process will be omitted. These layers are not shown in FIGS. 12 to 15. When the second electrode layer 81 is a transparent electrode layer, its corresponding portion may or may not be removed.

Figure 16:
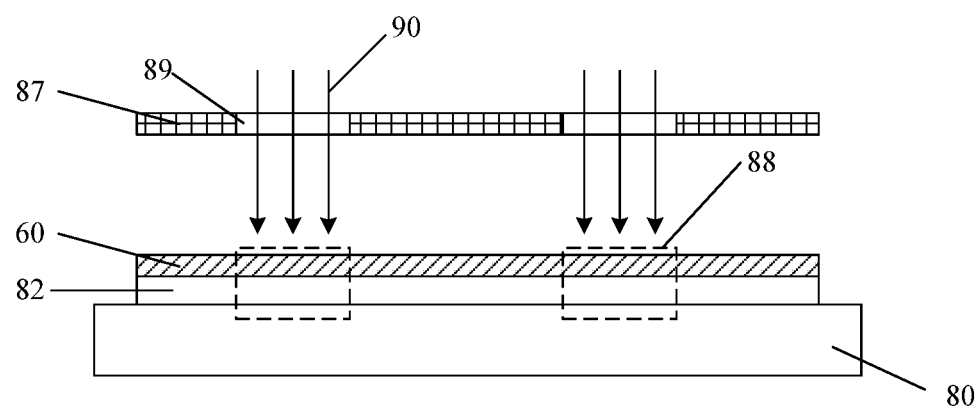
FIG. 16 illustrates a schematic view of forming a partial transparent region using plasma bombardment in accordance with embodiments of the present disclosure.

In some embodiments, it is also possible to directly remove the portions of the electrode layer and the light emitting material layer in a predetermined area so as to form the transparent portions in the predetermined area, without using the electrode removing portion. FIG. 16 shows an example in which the portions of the electrode layer and the light emitting material layer in a predetermined area are removed by means of plasma bombardment.

In this embodiment, the step S10 may include:

Step S101: forming a light emitting material layer and an electrode layer (for example, the first electrode layer 60) on the base substrate; and Step S102: removing the portion of the electrode layer in a predetermined area by plasma bombardment to form the transparent portions.

As shown in FIG. 16, after the light emitting material layer 82 and the first electrode layer 60 are formed on the base substrate 80, the portions of the light emitting material layer 82 and the first electrode layer 60 located in the predetermined area 88 may be bombarded by the plasma beam 90 so as to be removed. The predetermined area 88 may be defined by a mask 87. For example, the mask 87 is provided with a hole 89 aligned with the predetermined area 88. Through the hole 89, portions of the light emitting material layer 82 and the first electrode layer 60 located in the predetermined area 88 may be bombarded by the plasma beam 90 and thus removed so as to form the transparent portions.

Figure 17:
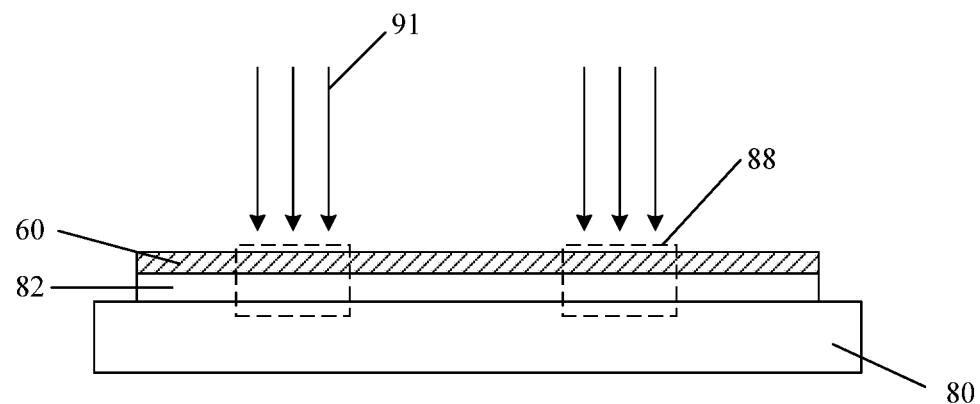
FIG. 17 illustrates a schematic view of forming a partial transparent region using laser ablation in accordance with embodiments of the present disclosure.
Figure 18:
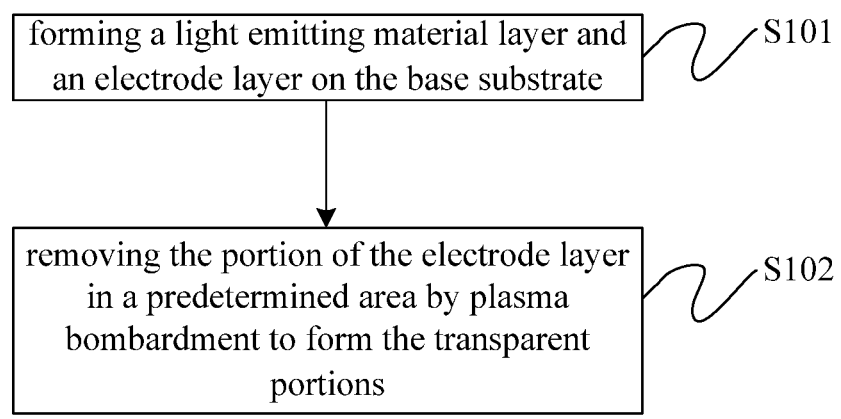
FIG. 18 shows another exemplary flowchart of the specific sub-steps of step S10 shown in FIG. 8.
Figure 19:
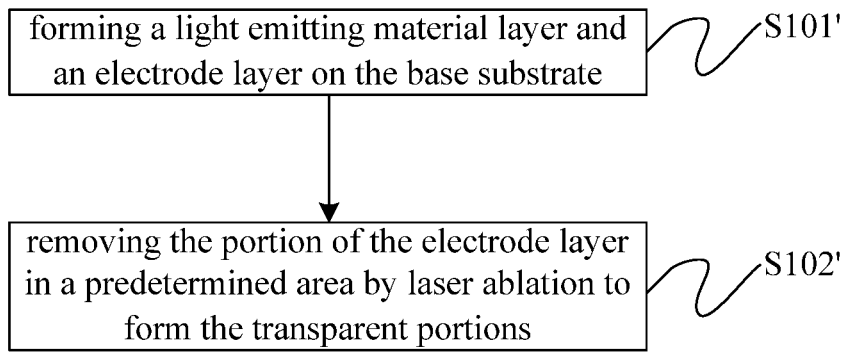
FIG. 19 shows still another exemplary flowchart of the specific sub-steps of step S10 shown in FIG. 8.

FIG. 17 shows an example in which the portions of the electrode layer and the light emitting material layer in a predetermined area are removed by means of laser ablation.

In this embodiment, the step S10 may include:

Step S101': forming a light emitting material layer and an electrode layer (for example, the first electrode layer 60) on the base substrate; and Step S102': removing the portion of the electrode layer in a predetermined area by laser ablation to form the transparent portions.

Compared to the embodiment shown in FIG. 16, the embodiment shown in FIG. 17 differs in that the portions of the light emitting material layer 82 and the first electrode layer 60 located in the predetermined area 88 are removed by laser ablation instead of plasma bombardment. In this embodiment, a laser beam 91 having sufficient energy can be directed to the predetermined area 88 to ablate and melt the portions mentioned above so as remove them. Through the laser ablation, the use of the mask 87 required in the plasma impact solution may be avoided. The positioning of the laser beam 91 can be implemented by any known mechanism for moving and positioning the laser.

In embodiments of the present disclosure, each pixel unit includes a light emitting device. The light emitting device may, for example, include an anode, a cathode, and an organic light emitting material layer between the anode and the cathode. As an example, a hole injecting layer, a hole transmitting layer, an electron transmitting layer, an electron injecting layer, and the like may be further included in the light emitting device to improve luminous efficiency. However, embodiments of the present disclosure are not limited thereto. Other known light emitting devices may also be employed. The embodiments of the present disclosure are not limited to OLED light emitting devices.

The present disclosure has been described with reference to the accompanying drawings, and the embodiments of the present disclosure are intended to be illustrative of the embodiments of the present disclosure and should not be considered limitation to the present disclosure. The scale in the drawings is merely illustrative and not to be construed as limiting the present disclosure.

The above-described embodiments are merely illustrative of the principles and construction of the present disclosure, and not intended to limit the present disclosure. Those skilled in the art would understand that any modification and improvement to the present disclosure may be made without departing from the general inventive concept. The protection scope of the disclosure should be determined by the scope defined by the appended claims of the present application.

What is claimed is:

1. A display panel comprising:
   a display area having a plurality of first pixel units and a plurality of first transparent portions, the first transparent portions being configured such that external light is transmitted through the first transparent portions from a first side of the display panel to a second side of the display panel,
   wherein at least two first pixel units are spaced apart by one or more first transparent portions, and
   wherein the display area comprises:
      an electrode layer that is non-transparent which extends in the plurality of first pixel units;
      an electrode layer lost region in an orthographic projection area of each of the plurality of first transparent portions;
      a light shielding layer on a light emitting side of the display panel, and
      a thin film encapsulation on the electrode layer,
      wherein the light shielding layer is provided with a first light shielding layer lost region in the light shielding layer in an orthographic projection area of each of the plurality of first pixel units, and provided with a second light shielding layer lost region in the orthographic projection area of each of the plurality of first transparent portions, the second light shielding layer lost region having an orthographic projection on a base substrate at least partly overlapped with an orthographic projection of the electrode layer lost region on the base substrate, and a color filter layer which allows a light of corresponding color emitted by the first pixel units to pass is provided in the first light shielding layer lost region, and
      wherein the light shielding layer and the color filter layer are arranged above the thin film encapsulation.

2. The display panel according to claim 1, wherein the electrode layer comprises a metal electrode layer.

3. The display panel according to claim 1, wherein all of portions of the electrode layers are electrically connected together.

4. The display panel according to claim 1, wherein the electrode layer comprises a cathode.

5. The display panel according to claim 1, wherein the display area comprises:
   a first region, in which the plurality of first pixel units and the plurality of first transparent portions are located; and
   a second region having a plurality of second pixel units, each second pixel unit of the plurality of second pixel units being adjacent to its surrounding second pixel units.

6. The display panel according to claim 5, wherein the display area further comprises a transition region between the first region and the second region and comprises a plurality of third pixel units and a plurality of second transparent portions, wherein a ratio of a total area of the plurality of second transparent portions to a total area of the plurality of third pixel units is smaller than a ratio of a total area of the plurality of first transparent portions to a total area of the plurality of first pixel units.

7. The display panel according to claim 1, wherein a ratio of a total area of the plurality of first transparent portions to a total area of the plurality of first pixel units is between 1:1 and 15:1.

8. The display panel according to claim 1, wherein the display panel is an organic light emitting diode display panel.

9. A method of manufacturing the display panel of claim 1 having a base plate and a plurality of the first pixel units disposed on the base plate, wherein the method comprises:
- forming one or more of the plurality of first transparent portions between at least two first pixel units to space apart the at least two first pixel units, the first transparent portions being configured such that external light is transmitted through the first transparent portions from a first side of the display panel to a second side of the display panel.

10. The method according to claim 9, wherein the step of forming one or more of the plurality of first transparent portions between at least two first pixel units to space apart the at least two first pixel units comprises:
- forming an electrode removing portion on the base plate;
- forming the electrode layer on the base plate provided with the electrode removing portion; and
- removing a portion of the electrode layer on the electrode removing portion to form the transparent portions.

11. The method according to claim 10, wherein the electrode removing portion comprises a protrusion.

12. The method according to claim 10, wherein the step of forming one or more of the plurality of first transparent portions between at least two first pixel units to space apart the at least two first pixel units further comprises:
- forming a light emitting material layer on the base plate provided with the electrode removing portion after the electrode removing portion is formed on the base plate.

13. The method according to claim 10, wherein the step of forming an electrode removing portion on the base plate comprises:
- forming a light emitting material layer on the base plate; and
- forming the electrode removing portion on the light emitting material layer.

14. The method according to claim 12, wherein the electrode layer and the light emitting material layer are formed by evaporation.

15. The method according to claim 13, wherein the electrode removing portion comprises anti-adhesion material.

16. The method according to claim 10, wherein the step of forming one or more of the plurality of first transparent portions between at least two first pixel units to space apart the at least two first pixel units further comprises:
- forming] the light shielding layer and the color filter layer on the electrode layer and removing portions of the light shielding layer and the color filter layer in an orthographic projection area of each of the transparent portions.

17. The method according to claim 9, wherein the step of forming one or more of the plurality of first transparent portions between at least two first pixel units to space apart the at least two first pixel units comprises:
- forming a light emitting material layer and the electrode layer on the base plate; and
- removing a portion of the electrode layer in a predetermined area by plasma bombardment to form the transparent portions.

18. The method according to claim 9, wherein the step of forming one or more of the plurality of first transparent portions between at least two first pixel units to space apart the at least two first pixel units comprises:
- forming a light emitting material layer and the electrode layer on the base plate; and
- removing the portion of the electrode layer in a predetermined area by laser ablation to form the transparent portions.

* * * * *